(12) United States Patent
Solal et al.

(10) Patent No.: US 6,344,705 B1
(45) Date of Patent: Feb. 5, 2002

(54) FILTER WITH SURFACE ACOUSTIC WAVE RESONATORS

(75) Inventors: Marc Solal, Antibes; Jean Desbois, Roquefort les Pins, both of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/601,321

(22) PCT Filed: Feb. 2, 1999

(86) PCT No.: PCT/FR99/00214

§ 371 Date: Aug. 7, 2000

§ 102(e) Date: Aug. 7, 2000

(87) PCT Pub. No.: WO99/40678

PCT Pub. Date: Aug. 12, 1999

(30) Foreign Application Priority Data

Feb. 6, 1998 (FR) ............................................. 98 01419

(51) Int. Cl.[7] ................................................. H03H 9/64
(52) U.S. Cl. ................... 310/313 B; 333/170; 333/189; 333/193
(58) Field of Search .................... 310/313 B, 313 R; 333/170, 186, 189, 193

(56) References Cited

U.S. PATENT DOCUMENTS

| 3,435,259 | A | * | 3/1969 | Mette ......................... 333/170 |
|---|---|---|---|---|
| 3,962,673 | A | | 6/1976 | Desbois et al. ................ 340/15 |
| 4,069,507 | A | | 1/1978 | Defranould et al. ......... 358/213 |
| 4,099,206 | A | | 7/1978 | Desbois et al. .............. 358/213 |
| 4,146,783 | A | | 3/1979 | Desbois et al. .............. 250/199 |
| 4,798,988 | A | * | 1/1989 | Mitsutsuka ............. 310/313 R |
| 4,916,416 | A | | 4/1990 | Desbois ....................... 333/195 |
| 5,020,034 | A | | 5/1991 | Solal et al. .................. 367/138 |
| 5,028,895 | A | * | 7/1991 | Fliegel ........................ 333/176 |
| 5,264,751 | A | | 11/1993 | Dufilie et al. ........... 310/313 B |
| 5,475,348 | A | | 12/1995 | Hode et al. .................. 333/195 |
| 5,703,427 | A | | 12/1997 | Solal et al. ............. 310/313 D |
| 5,847,626 | A | * | 12/1998 | Taguchi et al. .............. 333/193 |
| 5,936,487 | A | | 8/1999 | Solal et al. .................. 333/193 |
| 5,945,893 | A | * | 8/1999 | Plessky et al. .............. 333/195 |
| 6,011,344 | A | | 1/2000 | Dufilie et al. ........... 310/313 B |
| 6,043,726 | A | | 3/2000 | Solal et al. .................. 333/195 |

FOREIGN PATENT DOCUMENTS

JP 63-52509 A * 3/1988 ............. 310/313 R

* cited by examiner

Primary Examiner—Thomas M. Dougherty
(74) Attorney, Agent, or Firm—Oblon, Spivak, McClelland, Maier & Neustadt, P.C.

(57) ABSTRACT

A filter with surface acoustic wave resonators using an equivalent electrical bridge structure to obtain a good form relationship, i.e., a relationship between the filter rejection band and its pass band. Bridge arms advantageously include the paralleling of several resonators, thereby not requiring additional electrical elements as in the background art which provides for the use of series-connected resonators. Particular implantation methods for preparing equivalent structures to paralleling several resonators are also disclosed.

15 Claims, 11 Drawing Sheets

FILTER WITH SURFACE ACOUSTIC WAVE RESONATORS

BACKGROUND OF THE INVENTION

1. Field of the Invention

The field of the invention is that of surface-acoustic-wave filters with highly frequency selective performance characteristics, namely relatively small bandwidths with high rejection qualities. The term <<surface wave>> is understood here to mean not only Rayleigh waves but also any type of wave that can interact with interdigitated electrodes on the surface of a crystal or at the interface between a crystal and one or more layers of any material. The waves known as Pseudo SAW or Leaky SAW waves, the waves known as Surface Transverse Waves or SSBW (Surface Skimming Bulk Waves) may thus be considered to be surface waves and the invention can be applied to this type of wave as well as to any type of wave that meets the above conditions.

2. Discussion of the Background

In general, to obtain performance characteristics of this kind, filters are used with resonators conventionally formed by transducers contained in a cavity formed by two periodic arrays as shown in FIG. 1. More specifically, these are multipole filters obtained by coupling several resonators. It is sought indeed to couple the greatest number of resonators since the number of resonators coupled to each other generally determines the shape factor of the filter, namely the ratio between the rejection band of the filter and its passband. The increase in the number of resonators makes it possible to approach a shape factor of 1.

At present, there are known ways of making a surface-acoustic-wave filter configuration with two poles comprising a first pair of resonators $IDT_1$ with a center frequency $f_1$, a second pair of resonators $IDT_2$ with a center frequency $f_2$, the set of two pairs being mounted in an <<electrical equivalent>> bridge structure as shown in FIG. 2. This type of configuration is described in the U.S. Pat. No. 5,508,667.

The value of this structure lies in the fact that the product of the static capacitances of the first pair is the same as the product of the static capacitances of the second pair. This balancing makes it possible to ensure rejection by the filter far from its center frequency. Indeed, far from this frequency, the resonators are electrically equivalent to their static capacitance and the balancing makes it possible to prevent any signal from passing through.

To further increase the performance characteristics of the resonator filters, it is planned to set up a series cascade of several "electrical equivalent" bridge structures. Most frequently, identical bridges are cascade-connected with one another. The drawback of a structure of this kind lies in the fact that this cascade, in order to be efficient, requires the addition of a supplementary electrical element (an inductor or a capacitor). Furthermore, the use of several cascade-connected "bridges" is an obstacle as regards the mounting inside the pack of the filter.

SUMMARY OF THE INVENTION

This is why the invention proposes a filter structure that makes it possible to do away with the need for the coupling inductance in which a single equivalent bridge structure may comprise a large number of poles, through a parallel connection of different resonators in each arm of the bridge.

More specifically, an object of the invention is a surface-acoustic-wave filter with N poles, N being a number greater than or equal to 3 and comprising a set of resonators, characterized in that:

the resonators are electrically coupled to form a four-arm electrical bridge;

two arms comprising two identical sub-assemblies $E_1$ and $E_3$ of $N_1$ resonators each parallel-connected;

two arms comprising two identical sub-assemblies $E_2$ and $E_4$ of $N_2$ resonators each parallel-connected;

with $N_1+N_2=N$;

the product of the total static capacitance of the sub-assembly $E_1$ multiplied by the total static capacitance of the sub-assembly $E_3$ bring substantially equal to the product of the total static capacitance of the sub-assembly $E_2$ multiplied by the total static capacitance of the sub-assembly $E_4$, so as to balance the electrical bridge.

According to a first variant of the invention, if N is an even number, $N_1=N_2=N/2$.

According to a second variant of the invention, if N is an odd number, $N_1=(N-1)/2$ et $N_2=(N+1)/2$.

According to the filter configuration proposed in the invention, the parallel connection of the resonators requires connection wires or tracks on the substrate to make the bridges. To overcome this obstacle, a preferred mode of the invention consists not in making the parallel connection of the resonators physically but rather of the use, in the different arms of the bridge, of surface wave devices behaving like several parallel-connected resonators.

This is why, in at least one of the arms of the electrical bridge, the surface-acoustic-wave filter may comprise a single surface wave device having an admittance equivalent to the parallel connection of a sub-assembly of resonators.

In particular, the filter according to the invention may be characterized in that at least one arm comprises a structure equivalent to several parallel-connected resonators, said structure comprising two networks of interdigitated electrodes constituting the transduction part of the resonator, said networks being connected to two buses with different polarities in comprising m acoustic channels inserted between the two buses, the $i^{th}$ channel possessing a pitch $p_i$ of electrodes on a length of electrodes $w_i$ and $1 \leq i \leq m$.

According to one variant of the invention, the $i^{th}$ acoustic channel may comprise two reflective arrays on each side of the transduction part.

According to one variant of the invention, the surface-acoustic-wave filter may comprise, in at least one of the arms of the electrical bridge, a structure equivalent to at least two parallel-connected resonators, said structure comprising two interdigitated electrode arrays, said arrays being connected to a first bus and a second bus with different polarities so as to define a transducer having a central axis Z parallel to the electrodes, said arrays comprising a part of their electrodes positioned symmetrically with respect to the central axis, the transducer also comprising electrodes positioned symmetrically with respect to the central axis and connected to buses with different polarities so as to excite symmetrical longitudinal modes and antisymmetrical longitudinal modes. The arrays of electrodes may or may not be inserted between reflector arrays.

According to another variant of the invention, the surface acoustic filter comprises, in at least one of the arms of the electrical bridge, a DART type resonator with transduction cells interposed between reflection cells.

Advantageously, the DART type resonator may comprise resonant cavities.

When the number of poles is an even number, the distance between the transduction center of a transduction cell and the reflection center of the reflection cell adjacent to said transduction cell may preferably be in the range of $(3\pm d)\lambda/8+k\lambda/2$, with $\lambda$ being the wavelength corresponding to the center frequency of the filter, d being smaller than 1 and k being an integer.

BRIEF DESCRIPTION OF THE DRAWINGS

Finally, according to another variant, the surface-acoustic-wave filter comprises a series connection of several sets of resonators, of which at least one set of resonators corresponds to those of the invention.

The invention will be understood more clearly and other advantages shall appear from the following description, given as a non-restrictive example with reference to the appended drawings, of which:

FIG. 5b illustrates a first exemplary resonator installation equivalent to two parallel-connected resonators shown in FIG. 5a;

DESCRIPTION OF THE PREFERRED EMBODIMENT

Figure 1:
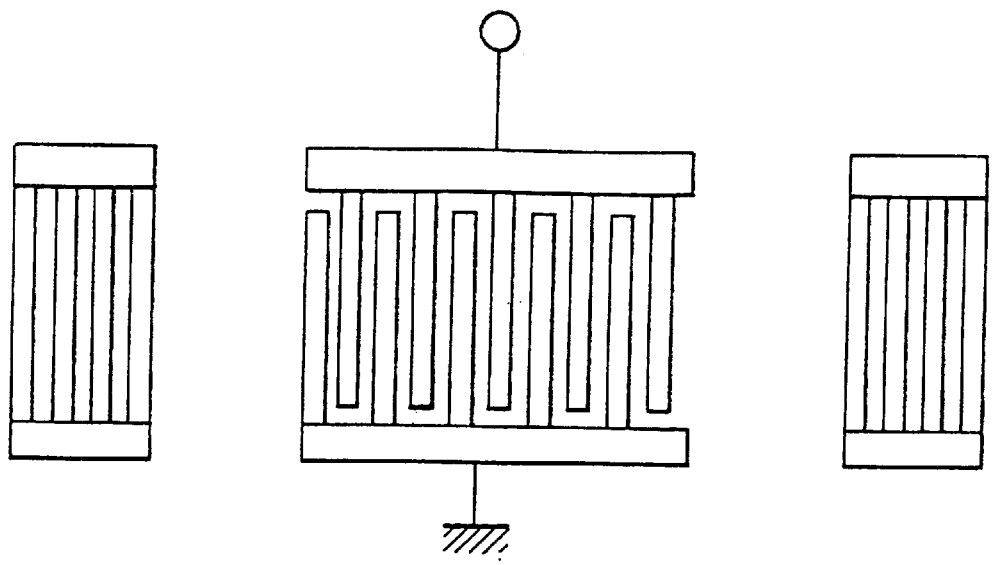
FIG. 1 gives a schematic view of a resonator with a transducer inserted between reflective arrays.
Figure 2:
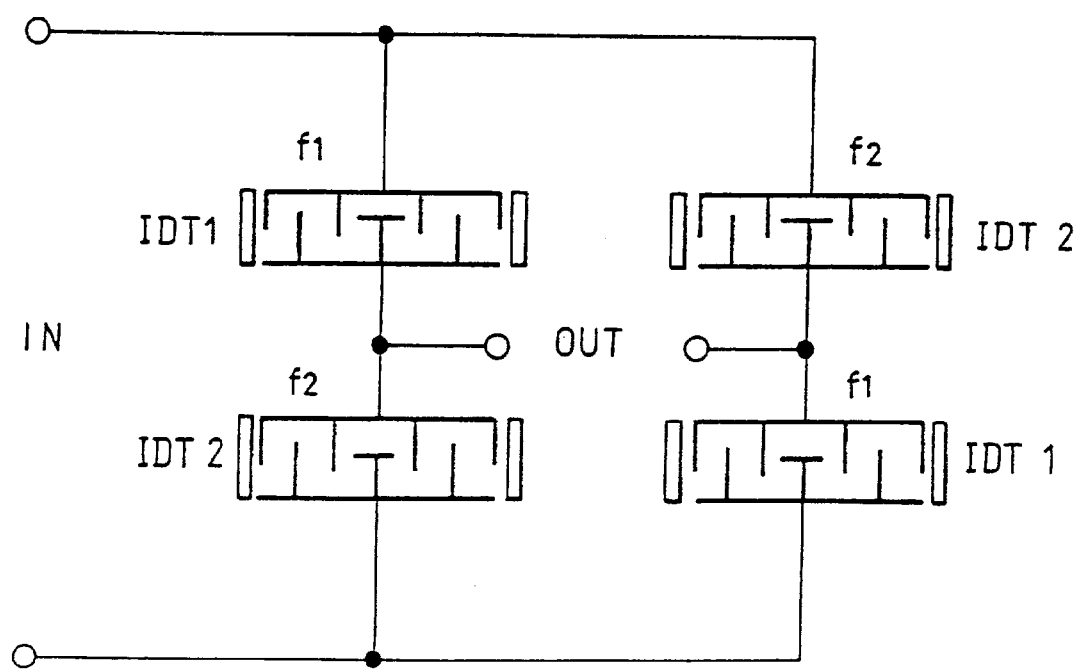
FIG. 2 illustrates configuration of a prior art filter mounted in a bridge structure.
Figure 3:
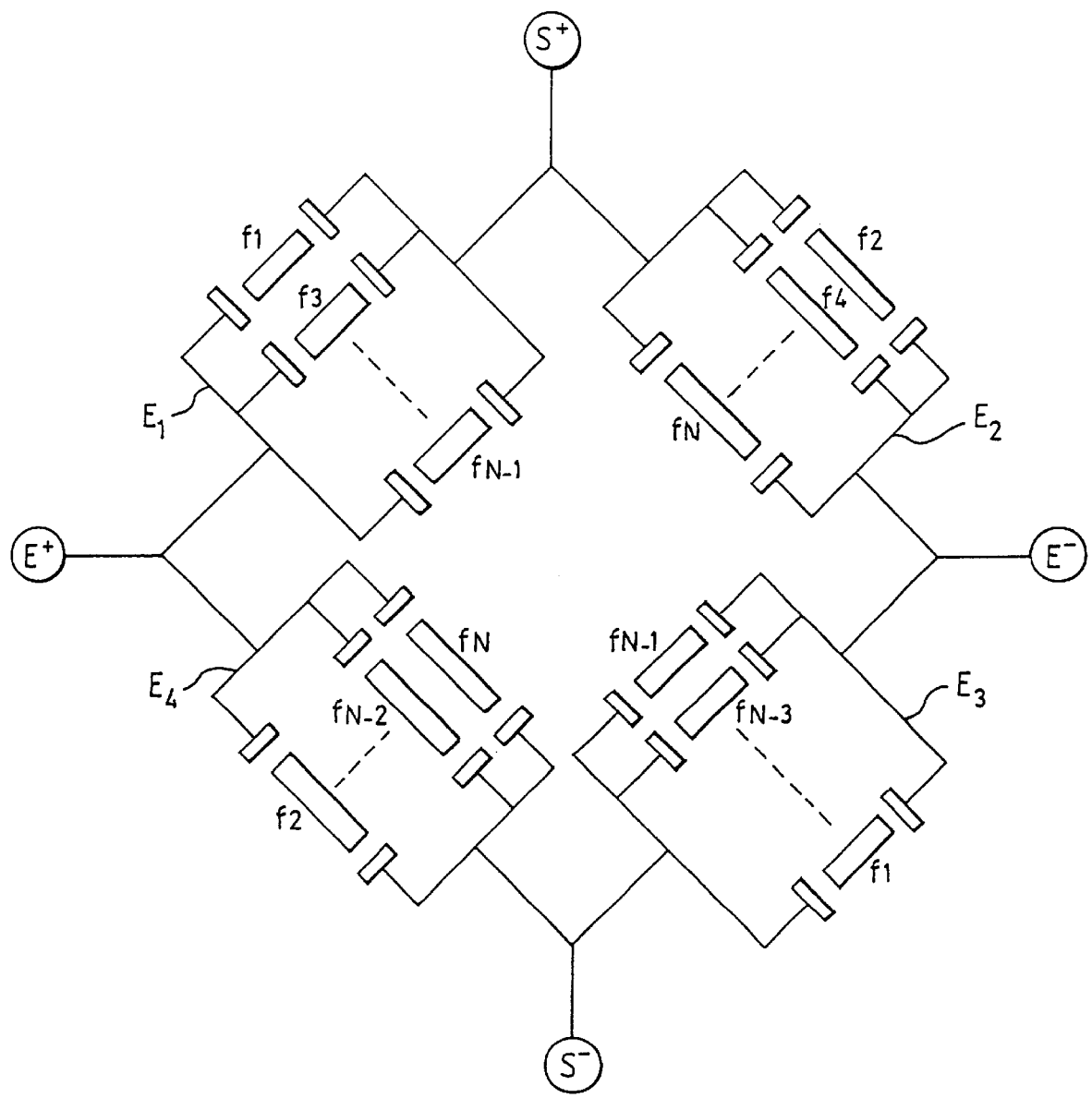
FIG. 3 gives a schematic view of a general configuration of a surface-acoustic-wave filter according to the invention.

The general configuration of a surface-acoustic-wave filter according to the invention is shown schematically in FIG. 3. It comprises a structure in the form of an equivalent bridge formed by four arms, each arm comprising a set of parallel-connected resonators connected to an input (E+, E−) and an output (S+, S−). The center frequencies of the resonators $f_1, f_2 \ldots f_N$ corresponding to the poles of the filter as well as the "couplings" of the different resonators are chosen to obtain the desired filtering function.

For a clear understanding of the operation, it is necessary to take a closer look at the working of a resonator. In general, it may be considered that, near the resonance frequency, the equivalent diagram of a resonator is given by a static capacitance in parallel with a series resonant circuit at the frequency $f_s$.

The admittance of the resonator is therefore the following (if we overlook the resistance Rs) where f is the frequency and $\omega$ is the pulsation ($\omega = 2\eta f$)

$$Y(f) = j\omega Cp + \frac{1}{Rs + jLs\omega - \frac{j}{Cs\omega}} \cong j\omega Cp - \frac{jCs\omega}{LsCs\omega^2 - 1}$$

$$Y(f) \cong j\omega Cp - \frac{j2\pi Csf}{4\pi^2 LsCs(f^2 - fs^2)} = j\omega Cp - j\frac{f}{2\pi Ls(f^2 - fs^2)}$$

$$= j\omega Cp - j\frac{2\pi Csfs^2 f}{(f^2 - fs^2)}$$

It is therefore possible to express the admittance of a resonator in the form of the sum of a capacitive term related to the parallel capacitance Cp and a resonant term proportional to the coefficient a:

$$Y(f) \cong j\omega Cp - j\frac{af}{(f^2 - fs^2)}$$

$$a = \frac{1}{2\pi Ls} = 2\pi Csfs^2$$

The coefficient a (proportional to the series capacitance of the resonator) determines the "coupling" of the resonance mode considered at the electrical access. It shall hereinafter be called the coupling of the mode.

An ideal resonator will therefore be characterized by the resonant part of its admittance which has the form:

$$-a \cdot j\frac{f}{f^2 - f_s^2}$$

and which therefore has a pole at the frequency $\pm f_s$. In practice, owing to the non-zero losses in the resonators which are approximately equivalent to a series resistance on the resonant part, the resonant term of the admittance is written as follows:

$$\frac{C_s\omega}{R_sC_S\omega + jL_sC_s[\omega^2 - \omega_s^2]}$$

The pole at the frequency $f=f_s$ (where $\omega=\omega_s$) is no longer a true pole since it is dampened. In other words, the losses convert the pole at the frequency $f=f_s$ into a pole with a complex real part close to $f_s$ and an imaginary part that is all the greater as the losses are great. A resonator is therefore characterized by an admittance comprising a resonance which may or may not be dampened and therefore has a pole on a frequency close to the real axis.

In this configuration, each of the arms comprises two parallel-connected resonators.

We shall now describe the invention in detail in the case of a four-pole surface-acoustic-wave filter.

Figure 4:
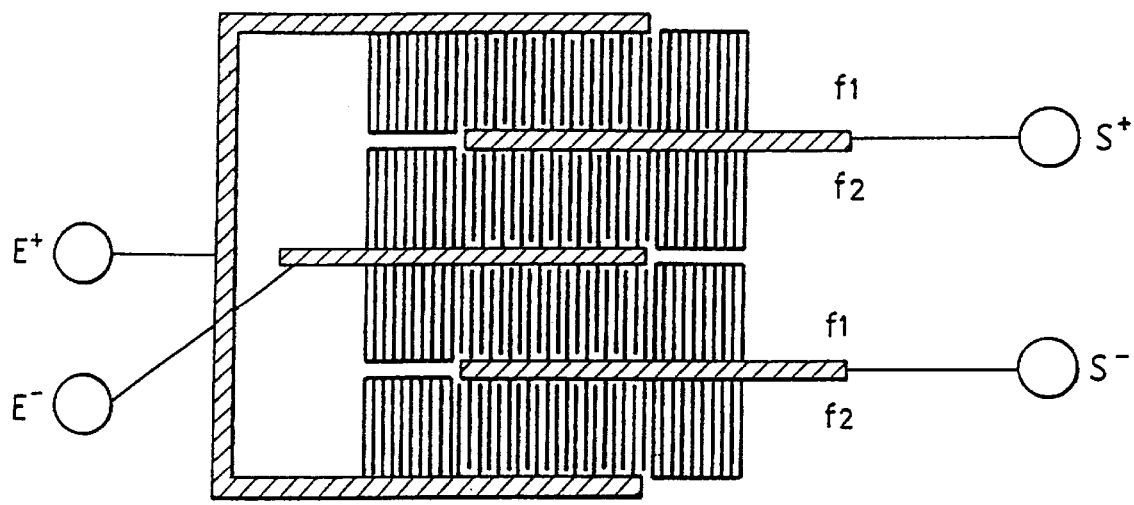
FIG. 4 illustrates an installation of a prior art two-pole surface-acoustic-wave filter.

According to the prior art, when it is sought to lay out a four-arm electrical bridge structure, each arm comprising a resonator, it is possible to design a symmetrical structure needed for the balancing of the bridge, and hence for the rejection qualities of the filter, with an installation of the type shown schematically in FIG. 4.

This installation has the advantage of being symmetrical to the back of the pack, even with regard to the parasitic capacitances. The surface areas of the reflector arrays $R_i$ are the same for the two ports, namely the + and − ports. Furthermore, the ground is not connected to the filters since the arrays are all connected to one of the input/output ports, thus making it possible to overcome any imbalances of the electrical source and load circuits more efficiently.

However, the symmetry that can be obtained with the installation described here above is more difficult to obtain when the number of poles is increased.

This is why, the invention proposes to replace the parallel connection of several resonators by making resonators that are equivalent to this parallel connection and that use only two connection buses and no longer four in the case of a parallel connection of two resonators (two inputs, two outputs).

Figure 5A:
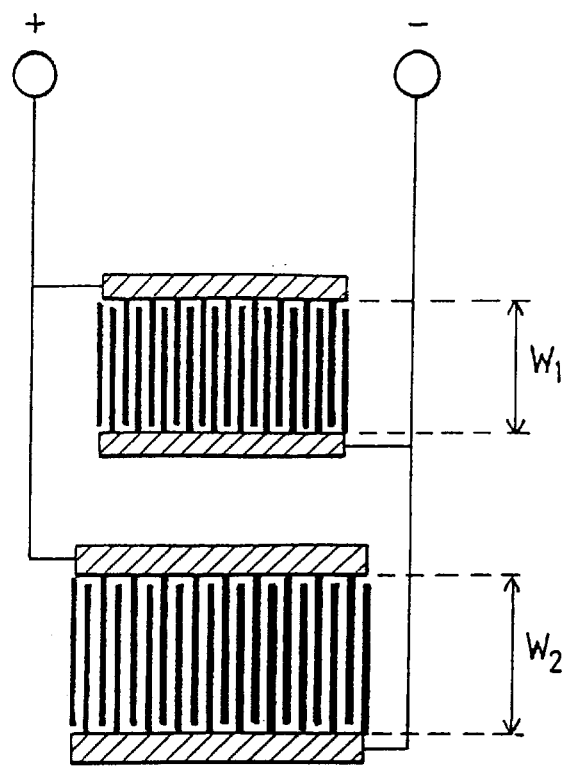
FIG. 5a gives a schematic view of an installation of a surface-acoustic-wave filter comprising two parallel-connected resonators.

In particular, it is possible to make a resonator equivalent to two parallel-connected resonators by separating the acoustic aperture into two channels and interconnecting the electrodes of two channels so as to have, on each of the two channels, the sequence corresponding to one of the two transducers. As an example, FIG. 5a shows a possible installation for an assembly of two parallel-connected resonators.

Figure 5B:
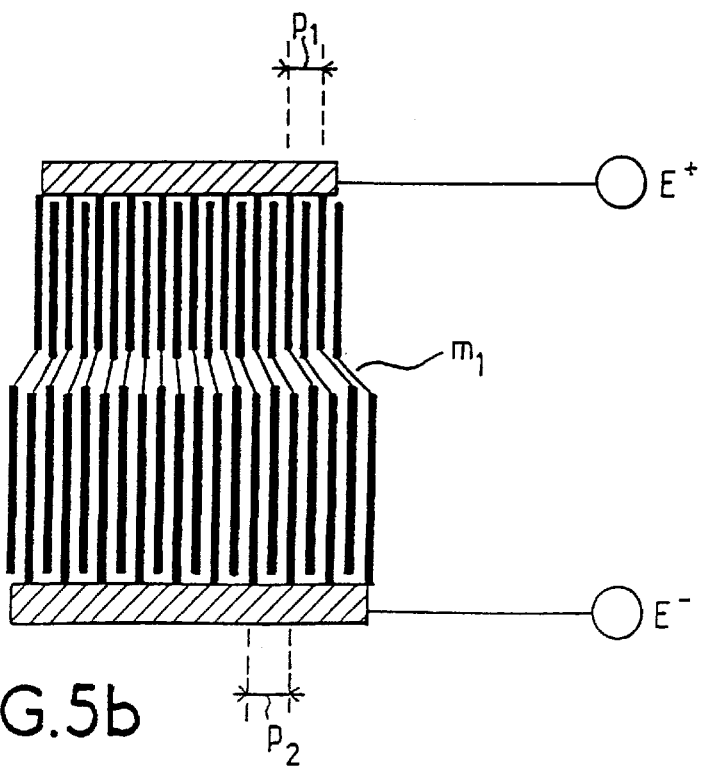

FIG. 5b illustrates an equivalent installation in which the first upper acoustic channel is made by means of electrodes that are interdigitated at the pitch $p_1$, the second lower acoustic channel being made by means of electrodes that are interdigitated at the pitch $p_2$. The two channels are electrically connected by metallizations $m_1$ shown symbolically in the figures.

The pitch values $p_1$ and $p_2$ govern the resonance frequencies of the resonator equivalent to the two parallel-connected resonators. The dimensions $w_1$ and $w_2$ condition the coupling of these resonators so as to obtain the characteristics of the filter to be manufactured. FIGS. 5a and 5b show only the transducer part of the resonators. According to the prior art, the resonators generally comprise two reflector arrays on either side of a transducer. The reflector arrays are omitted in the figure but may be added on each of the channels. The arrays of each of the channels may be connected or not connected together. Preferably, for the reflector arrays of the different channels, the periods chosen are proportional to the periods of the transducers. In other words, if $p_i$ and $p_j$ are the periods of the two transducers and $P_{Ri}$ and $PrR_j$ are the periods of the arrays, the following will be chosen:

$$\frac{P_i}{P_j} = \frac{PR_i}{PR_j}$$

Similarly, if $\Delta$ and $\Delta'$ are the distances between the reflector arrays and the transducers, the following will be chosen preferably:

$$\frac{\Delta i}{\Delta j} = \frac{Pi}{Pj}.$$

In this way, the two channels are homothetical with each other.

Finally, for the filters having more than four poles, it becomes necessary to place more than two resonators in parallel. It is even possible, in the same way as here above, to use several acoustic channels and connect the metallizations of the different channels together to set up the parallel connection.

However, in this type of configuration, when the two acoustic channels with sizes $w_1$ and $w_2$ are too close to each other, phenomena of parasitic acoustic crosstalk appear between the channels.

Figure 6:
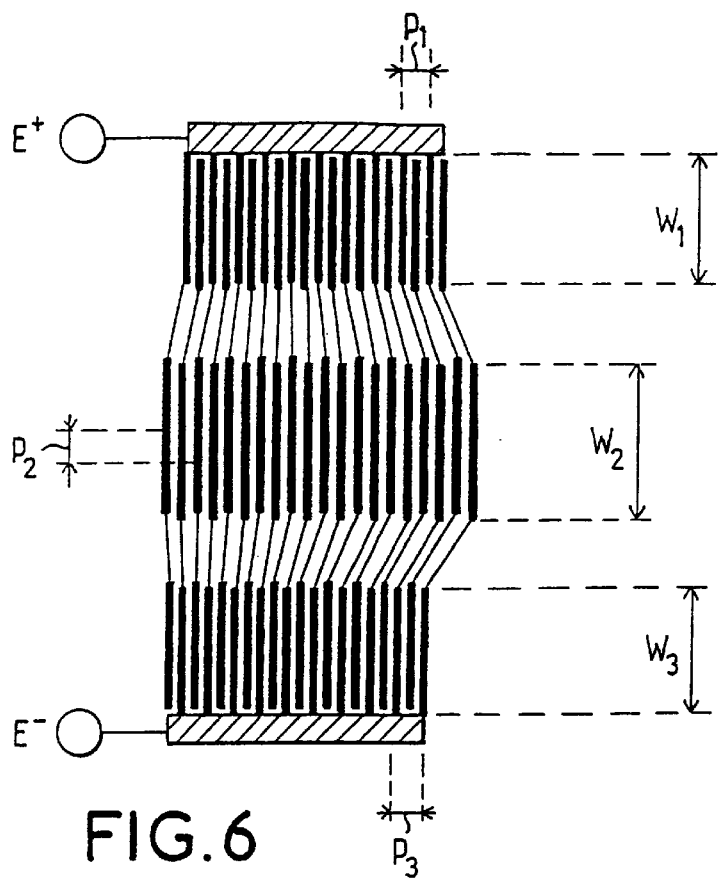
FIG. 6 illustrates a second exemplary installation of a resonator equivalent to two parallel-connected resonators, using three acoustic channels.

This is why, to eliminate this type of crosstalk, the invention also proposes another structure shown in FIG. 6. For this purpose, the central channel, which generates an excitation that is symmetrical with the horizontal axis and is therefore coupled only to waves having transversely symmetrical forms, is inserted between two upper and lower channels corresponding on the whole to one of the acoustic channels shown in FIG. 5b. The upper and lower acoustic channels have the same characteristics of electrode dimension $w_1=W_3$ and electrode pitch $p_1=P_3$. These two channels generate an antisymmetrical excitation with respect to the horizontal axis since the facing electrodes for the two channels are connected to opposite potentials. These two channels are therefore coupled only to waves having transversely antisymmetrical forms and there can therefore be no crosstalk between the central channel and the external channels. In other words, owing to the connection of the electrodes facing the end channels to the opposite bus, the crosstalk between the central channel and the top channel gets added up in phase opposition and therefore gets cancelled out with the crosstalk between the central channel and the lower channel. To obtain compensation for the coupling phenomena, the electrodes connected to the bus E+ are placed so as to be facing the electrodes connected to the bus E− on the end channels.

The two resonance frequencies sought in order to reconstitute two parallel-connected resonators may also be obtained by means of the difference in speed between the symmetrical and antisymmetrical transversal modes.

Figure 7:
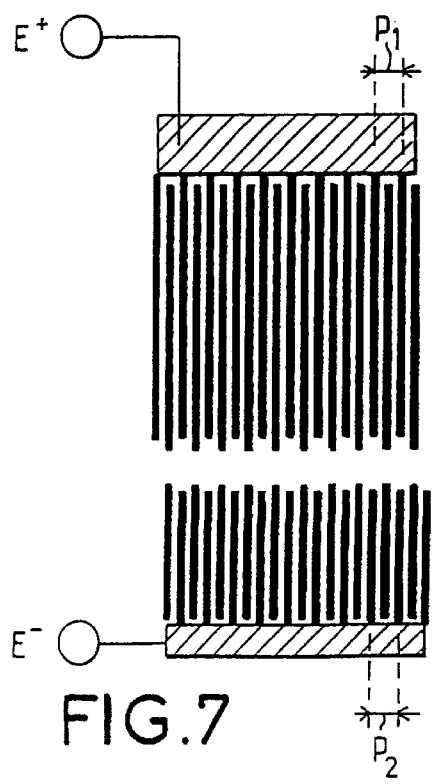
FIG. 7 illustrates a third exemplary installation of a resonator equivalent to two parallel-connected resonators using two acoustic channels, but offset by a pitch $p_i$.

In this case, it is also possible to make a structure in which the pitch values $p_1$ and $p_2$ are equal. In this particular case, it even becomes possible to make a structure with two acoustic channels as shown in FIG. 7. By offsetting the electrodes of the two channels by a distance of $p_1$ from each other, it becomes possible to obtain a compensation, in the same way as explained here above, in the parasitic coupling phenomena since it becomes possible to place the electrodes connected to the bus E+ so that they face electrodes connected to the bus E−. In this configuration, the central channel becomes aligned with one of the end channels.

According to another variant of the invention, it is possible to make a structure equivalent to two parallel-connected resonators by parameterizing the number of longitudinal modes created in the resonator.

Indeed, in general, a resonator is a transducer placed between two reflector arrays. Depending on the period of the array and that of the transducer and depending on the distance between the arrays and the transducer, we are in the presence of several longitudinal modes. The coupling of a mode depends on the integral of overlapping of the weighting of the transducer on the amplitude of the mode in the cavity. In general, we are in the presence of symmetrical and antisymmetrical modes. It is possible to weight the transducer so as to obtain the desired couplings with the symmetrical and antisymmetrical modes.

Figure 8:
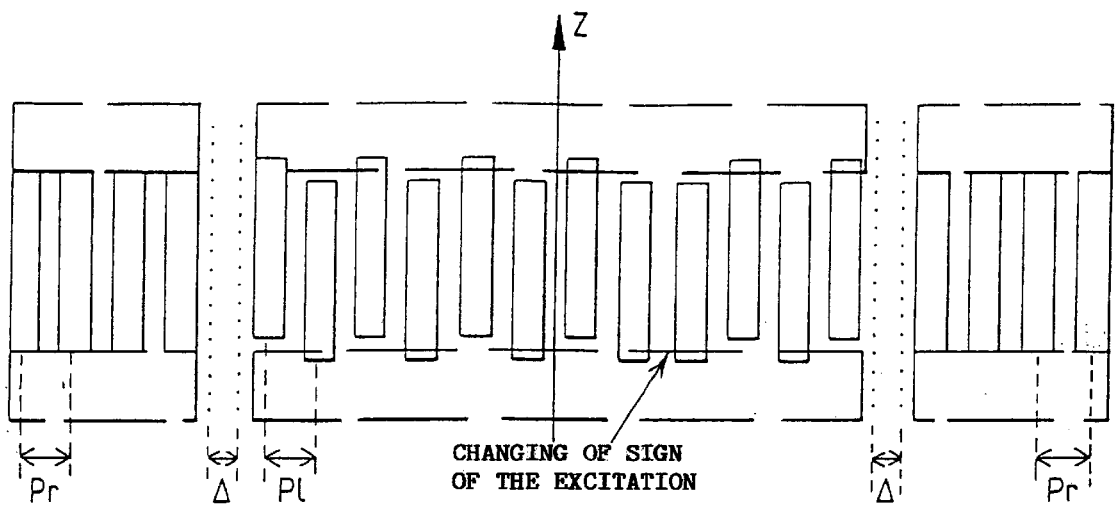
FIG. 8 illustrates a fourth exemplary installation of a resonator equivalent to two parallel-connected resonators, using the excitation of symmetrical modes and antisymmetrical modes longitudinally.

FIG. 8 shows an exemplary resonator in which it is possible to excite both the symmetrical longitudinal modes and the antisymmetrical longitudinal modes.

$P_r$ represents the pitch of the constituent elements of the arrays 1 and 2. $P_t$ represents the pitch of the electrodes of the transducer. $\Delta$ represents the spacing between the transducer and an array. The transducer has a dissymmetry with respect to the axis Z centered on the transducer.

Depending on the periods $P_r$ and $P_t$, the distance $\Delta$ and the number of periods of the transducer, the resonance cavity will have several resonance frequencies corresponding to different longitudinal distributions of energy in the cavity. By appropriately choosing the excitation, namely the sequence of electrodes of the transducer, it is possible to excite the symmetrical longitudinal modes and the antisymmetrical longitudinal modes. The weighting of the transducer may be subdivided into two parts. The symmetrical part (with reference to the z axis) of the weighting will excite the symmetrical longitudinal modes while the antisymmetrical part (with reference to the z axis) will excite the antisymmetrical longitudinal modes. The integral of overlapping of the symmetrical (or antisymmetrical) part of the weighting on the amplitude of the symmetrical (antisymmetrical) modes will be related to the coupling of the symmetrical (antisymmetrical) modes.

The transducer shown in FIG. 8 is neither entirely symmetrical nor entirely antisymmetrical and enables the excitation of both symmetrical modes and antisymmetrical modes so as to reconstitute the intermode coupling and thus the equivalence with two parallel-connected resonators.

According to another variant of the invention, the surface-acoustic-wave filter comprises DART (Distributed Phase Unidirectional Transducer) type transducers also known in the literature as SPUDT (Single Phase Unidirectional Transducers).

This type of transducer, which is described in the published patent application Ser. No. 2,702 899, is obtained by the interposing, in a transducer, of the cells known as transduction cells and the cells known as reflection cells and by positioning the cells with respect to one another so that the waves sent are reset in phase with the reflected waves in the useful direction and are placed in phase opposition in the other direction. For the usual substrates, the distance between the transduction center and the reflection center must be $3\lambda/8$ so that the phases are correct. More generally, a DART may be considered to be a transducer in which electrodes are distributed. These electrodes are designed so that, within the transducer, there is a transduction function and a reflection function and so that the transducer has a preferred direction. It was shown in the patent application published under Ser. No. 2,702,899 that it was advantageous to make resonant cavities within the DART, a resonant cavity being made by changing the sign of the reflection function.

Figure 9:
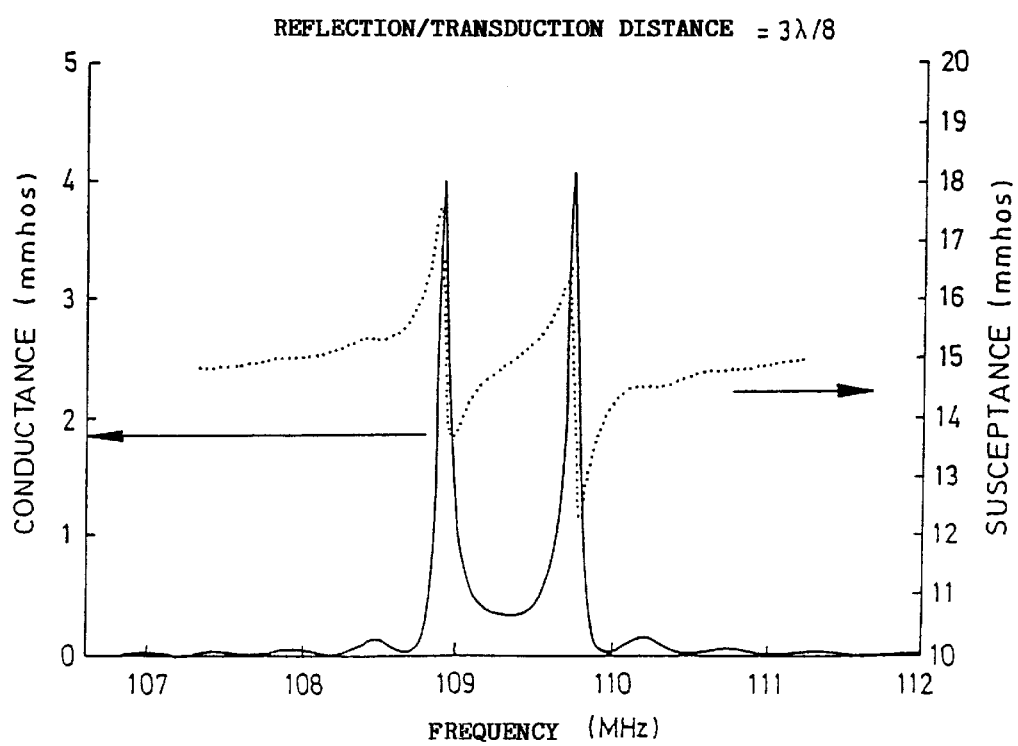
FIG. 9 illustrates the admittance of an exemplary DART type transducer in which the center of a transduction cell is separated from the center of an adjacent reflection cell by a distance $3\lambda/8$.

It is known that, in the case of a non-weighted DART, namely one comprising functions of reflection and transduction that are constant and long enough for its overall reflection coefficient to be close to 1, there are two modes existing at the starting and ending frequencies of the rejection band of the reflectors. Should the phase difference between reflection and transduction correspond to a resetting in phase of the waves sent and reflected in the useful direction, namely in general should the distance between the transduction center and the reflection center be $3\lambda/8$, the two modes are excited identically and the conductance of the transducer is symmetrical in frequency. By way of an example, FIG. 9 shows the admittance of a DART transducer with a length 200 $\lambda$ at 109.3 MHz. The thickness of the metallization chosen is 0.7 $\mu$m and one reflector with a width of $3\lambda/8$ is used per wavelength. The transducer is "ideal", namely the distance between the transduction center and the reflection center is $3\lambda/8$.

Figure 10:
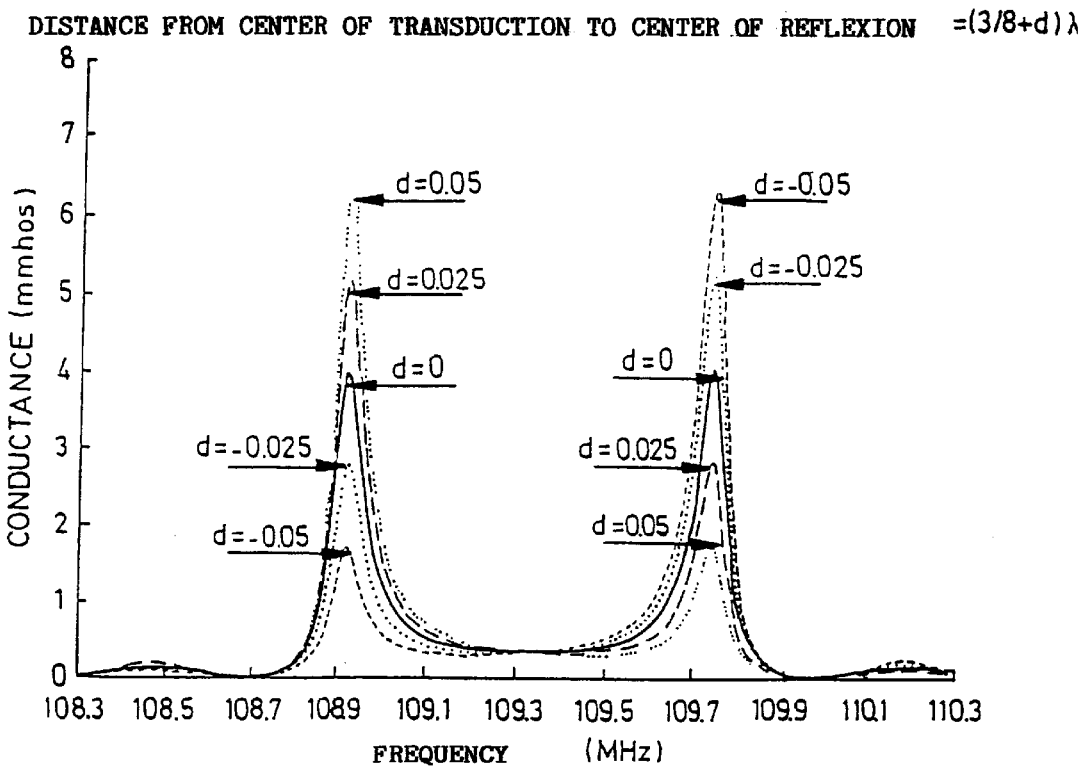
FIG. 10 illustrates the progress of the conductance of the same DART type transducer in which the center of a transduction cell is separated from the center of an adjacent reflection cell by a distance varying from $(3-0,4)\lambda/8$ to $(3+0,4)\lambda/8$.
Figure 11:
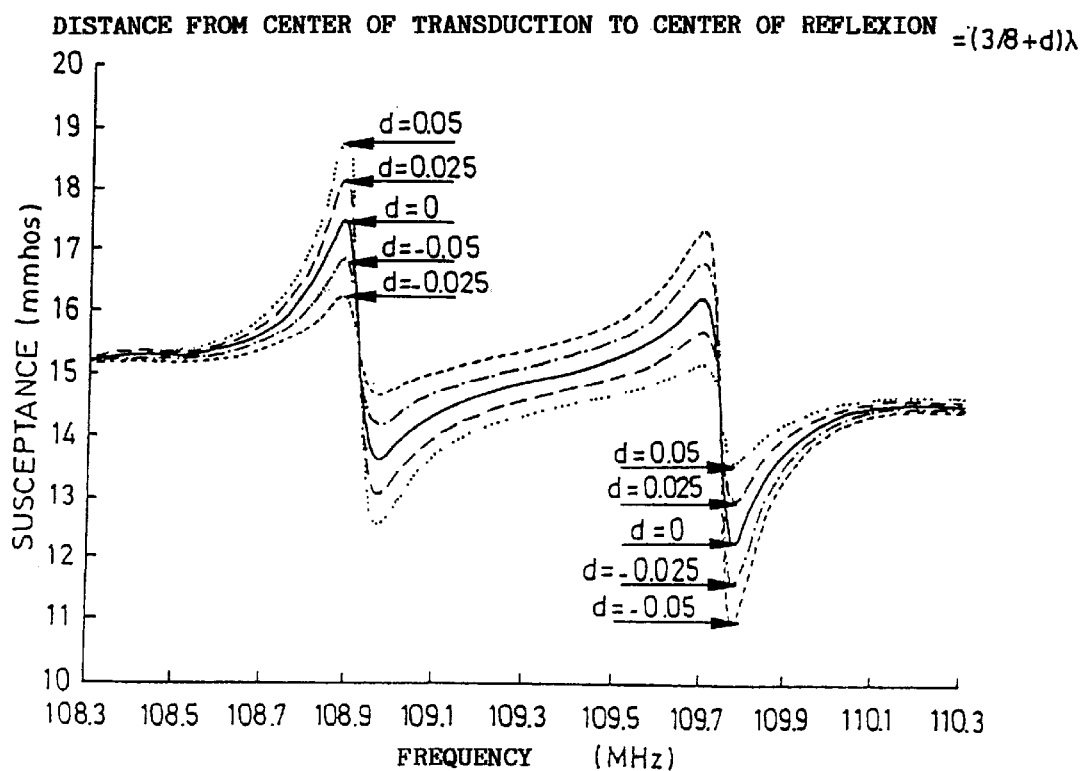
FIG. 11 illustrates the progress of the susceptance of the same DART type transducer in which the center of a transduction cell is separated from the center of an adjacent reflection cell by a distance varying from $(3-0,4)\lambda/8$ to $(3+0,4)\lambda/8$.
Figure 12:
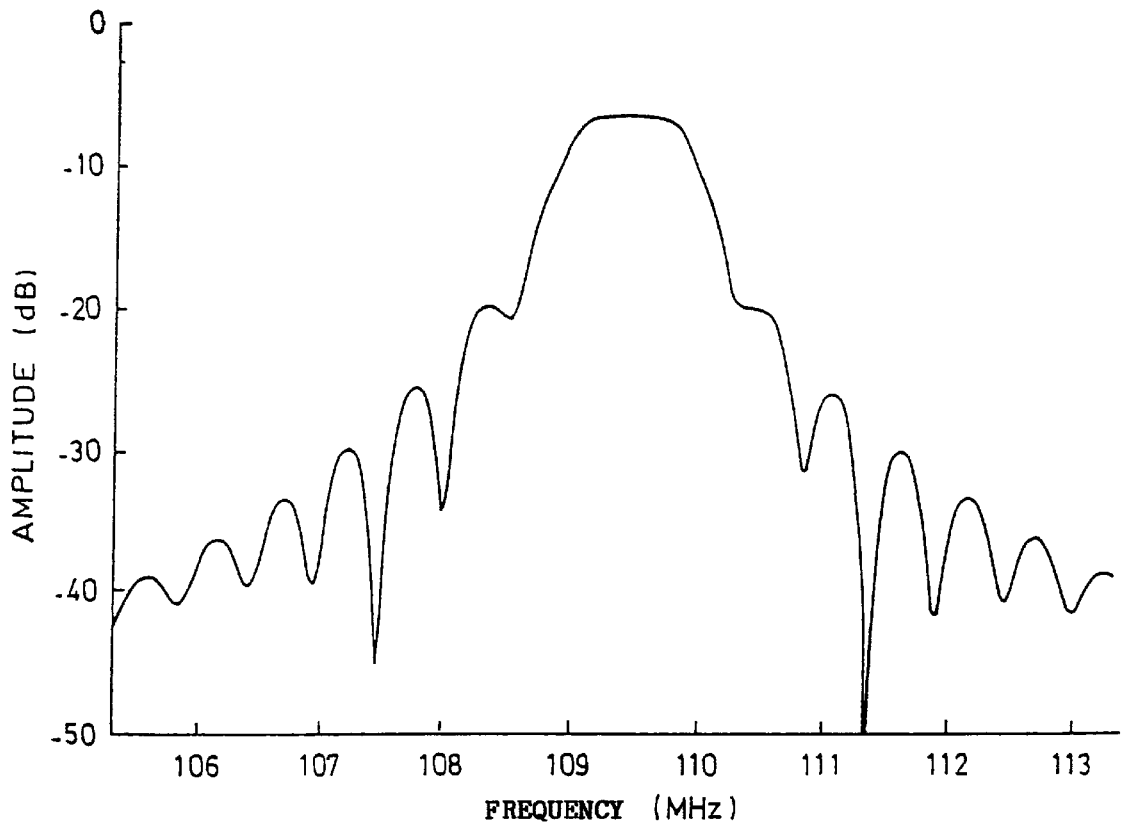
FIG. 12 illustrates the transfer function for an exemplary four-pole filter according to the invention, using DARTs.

FIGS. 10 and 11 show the changes undergone by the conductance and susceptance values when the distance between the transduction center and the reflection center varies from $3\lambda/8-0.05\lambda$ to $3\lambda/8+0.05\lambda$. It can be seen that we are still in the presence of the same two modes but that their relative importance varies according to the distance. Furthermore, when the sign of the shift is changed, the same conductance is obtained for the modes, except for a symmetry. In the case of a four-pole filter, it is generally useful, in an arm of the electrical bridge, to use modes such that their coupling is in a ratio of about 2. For example, the filter according to the invention may comprise, in one of its arms, a DART using a shift of $-0.025$ $\lambda$ and, in the other arm, a DART using a shift of $+0.025$ $\lambda$. So as to have four distinct resonance frequencies, the transducer using a $-0.025$ $\lambda$ shift has been given a downward frequency shift of about 250 kHz. FIG. 12 shows the transfer function obtained for the electrically tuned filter.

Figure 13:
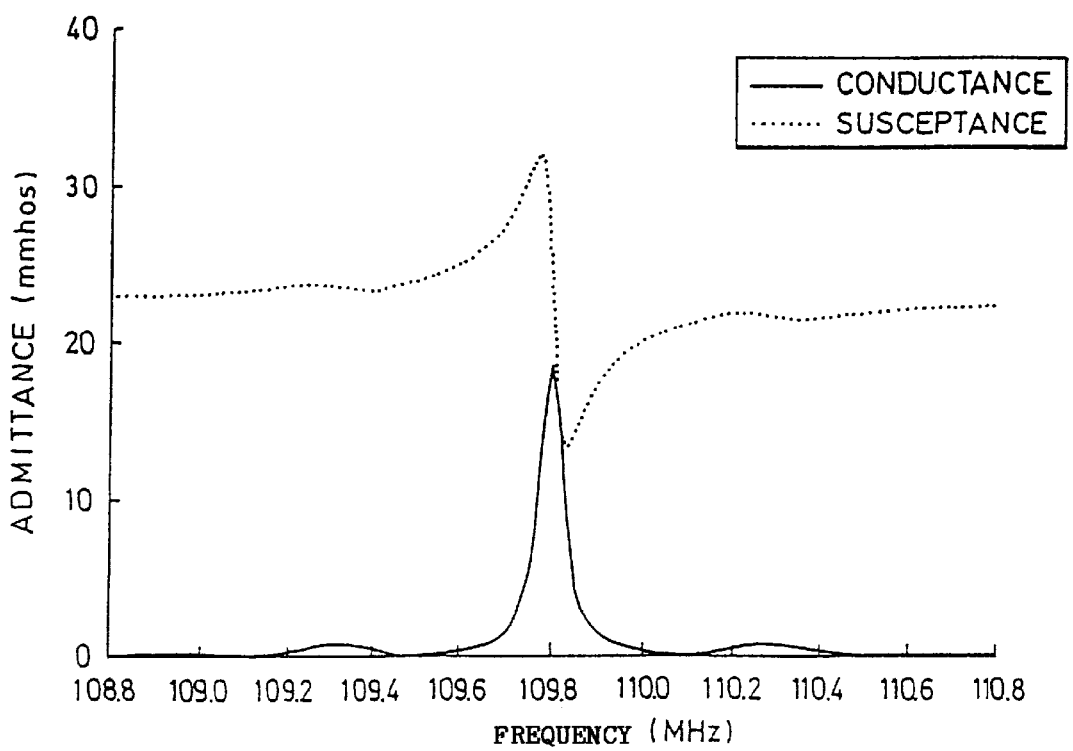
FIG. 13 illustrates the admittance of an electrical bridge arm comprising a two-mode DART used in an exemplary filter according to the invention with three poles.
Figure 14:
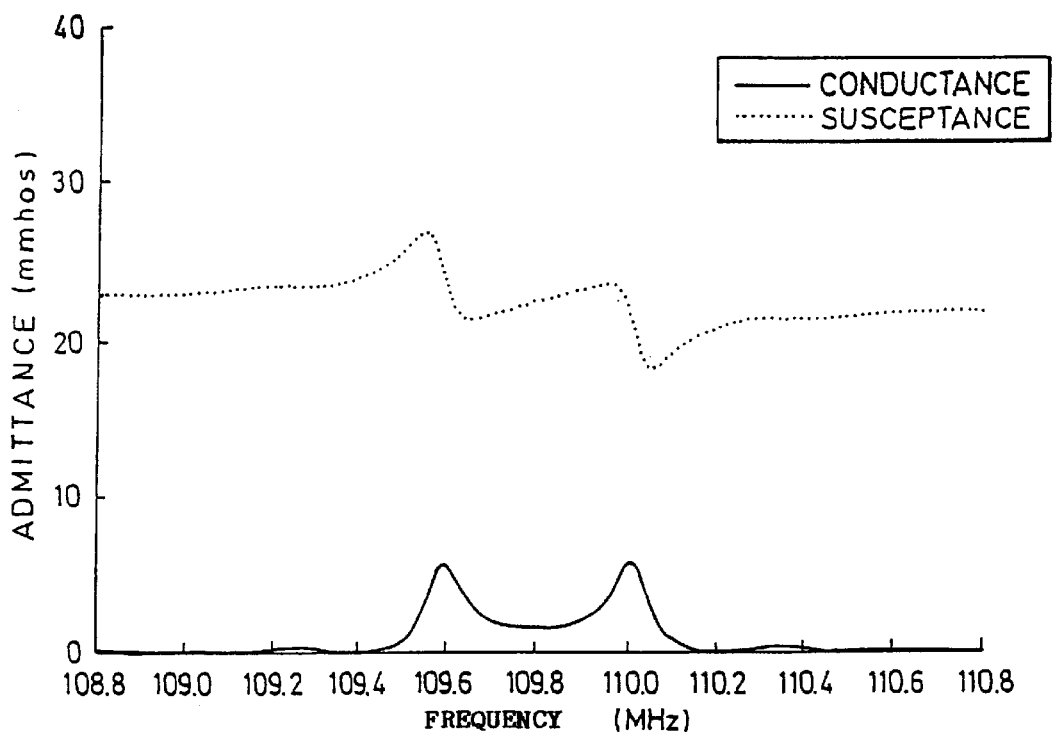
FIG. 14 illustrates the admittance of the second electrical bridge arm comprising a non-weighted DART in an exemplary filter according to the invention with three poles.

According to another example using DARTs, a three-pole filter may be obtained by using a one-mode resonator in one of the arms and a two-mode resonator in the other arm. The two-mode resonator used in the example is a non-weighted DART with a transduction/reflection distance of $3\lambda/8$. The DART has a length of 400 wavelengths. The thickness of the metallization chosen is 0.35 $\mu$m and a reflector with a width of $3\lambda/8$ is used per wavelength. The center frequency is 109.8 MHz. FIG. 13 shows the admittance of the DART with its two modes at the input and output of the rejection band. For the other arm of the electrical bridge, it has been chosen to use a DART that has the same length (and hence the same static capacitance) and resonates at the center frequency. FIG. 14 shows the admittance of the non-weighted DART included in the other arm of the electrical bridge. This has been obtained by inserting a change in sign of the reflection function at the center of the transducer. There is then a single resonance mode.

Figure 15:
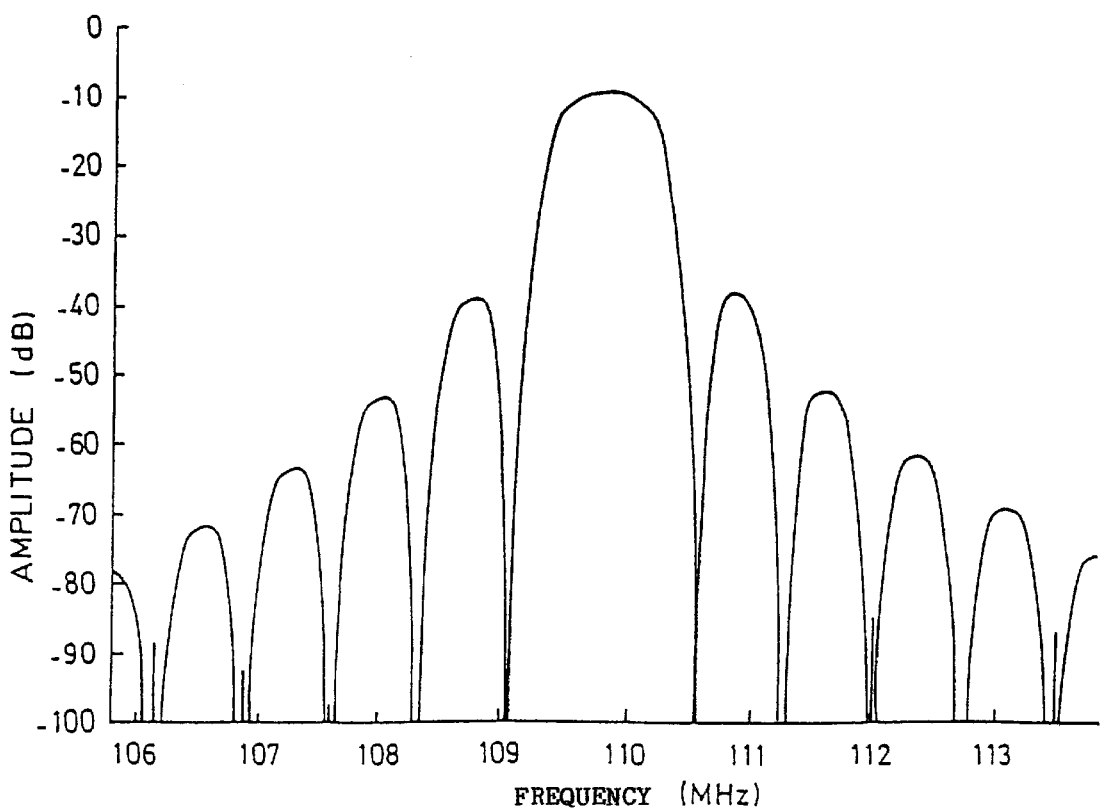
FIG. 15 illustrates the transfer function of the same exemplary filter according to the invention with three poles, comprising a one-mode resonator in one arm and a two-mode resonator in the other arm.

The transfer function obtained for the three-pole filter is given in FIG. 15.

Exemplary quartz filter at 87 MHz

This is a filter with a passband of about 300 kHz in a very small pack (7 mm×5 mm) with a number of poles N equal to 4.

Figure 16:
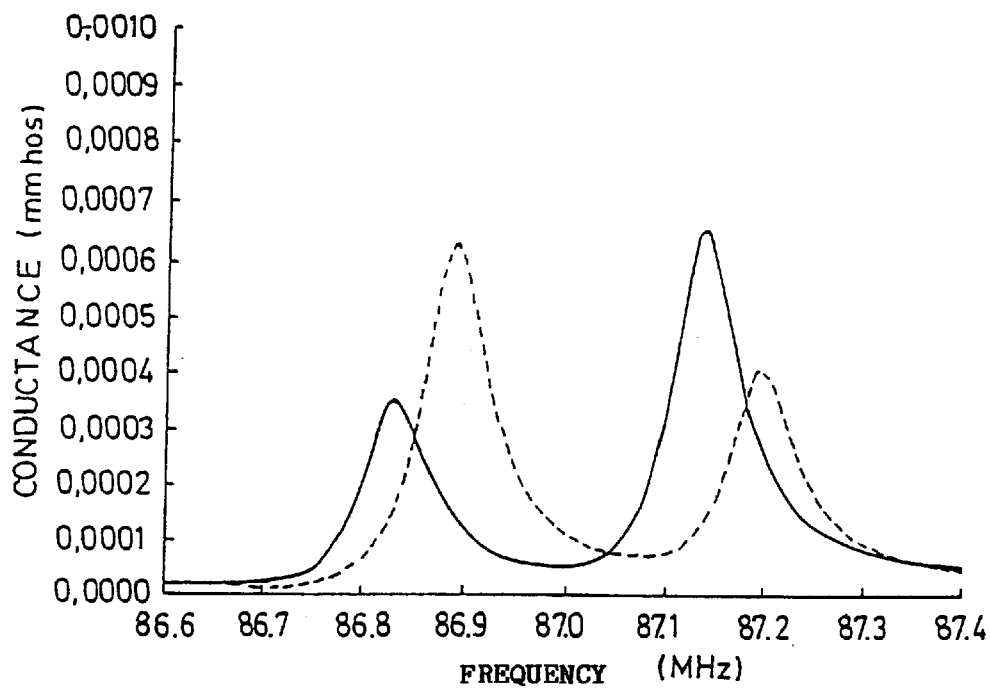
FIG. 16 illustrates the conductance values of two resonators used in an exemplary 87 MHz filter according to the invention using resonators of the type shown in FIG. 6.
Figure 17:
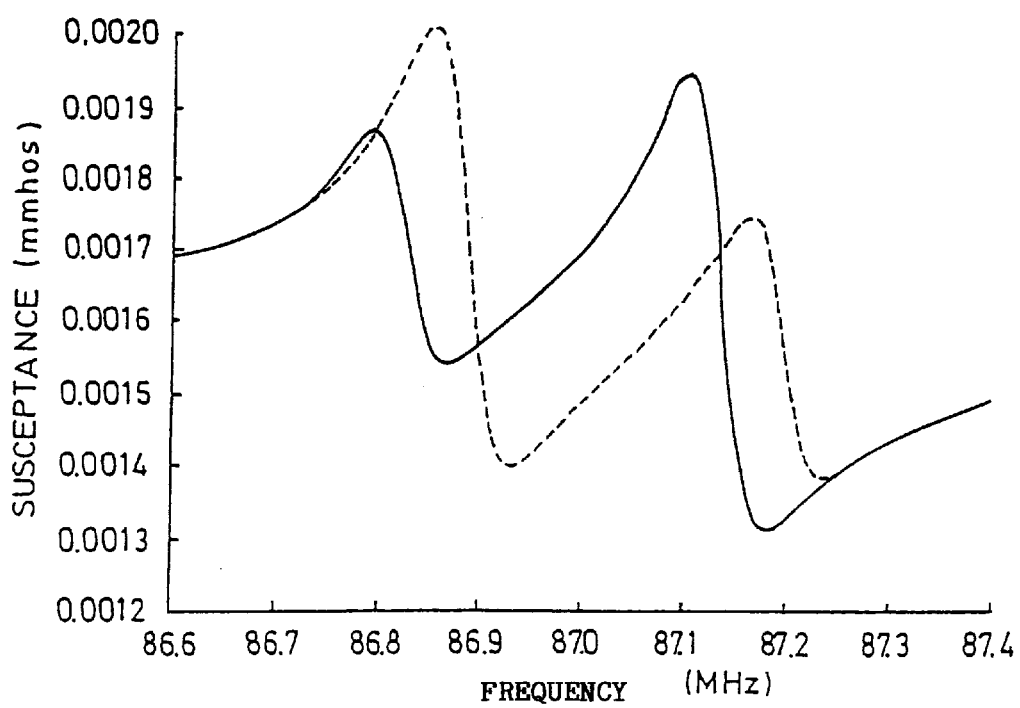
FIG. 17 illustrates the susceptance values of two resonators used in an exemplary 87 MHz filter according to the invention using resonators of the type shown in FIG. 6.
Figure 18:
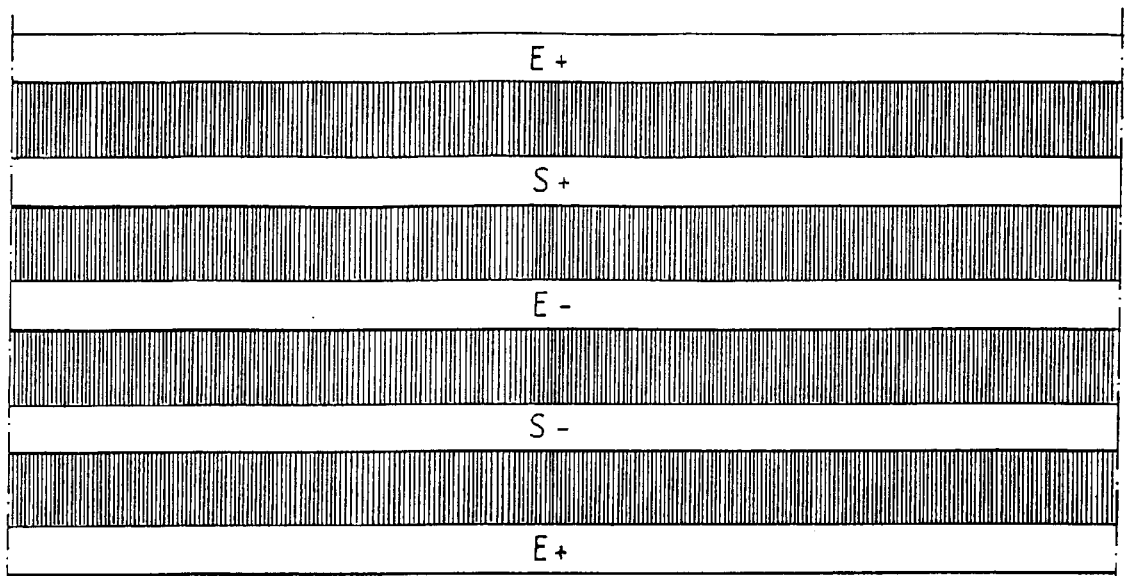
FIG. 18 illustrates the installation of the filter whose characteristics are given in FIGS. 15, 16 and 17.

To achieve this low space requirement of the pack, the resonators used do not have reflector arrays and are therefore reduced to simple transducers with two electrodes per wavelength The installation is of the type shown in FIG. 18. The lengths of the transducers are 264 periods (i.e. a length of 4.75 mm approximately). It we overlook the losses, the admittance values of the arms are given roughly by:

$$Y_s(f) = j\left(\frac{a_1 f}{f^2 - f_1^2} + \frac{a_3 f}{f^2 - f_3^2}\right) + jCw$$

$$Y_a(f) = j\left(\frac{a_2 f}{f^2 - f_1^2} + \frac{a_4 f}{f^2 - f_4^2}\right) + jCw$$

by choosing:
$f_2 - f_1 = 250$ kHz
$f_3 - f_2 \sim 60$ kHz and $a_2 = a_1$, $a_3 = a_4 = a_1/2$
$f_1 - f_4 \sim 60$ kHz The characteristics of conductance values and susceptance values obtained, as a function of the frequency, are illustrated respectively in FIGS. 16 and 17.

To obtain the admittance values desired for the resonators, it is chosen to have an aperture and a metallization thickness that provide for a difference of 310 kHz between the resonance frequencies of the first symmetrical transversal mode and the first antisymmetrical transversal mode, giving a metallization thickness of 0.8 µm and a transducer aperture of about 300 µm.

The structure of FIG. 7 has been chosen for the resonators.

Thus, for the two resonators, we have the following characteristics:

1st resonator (equivalent to two parallel-connected resonators):
  $w'_1 = 210$ µm
  $w'_2 = 90$ µm 2nd resonator (equivalent to two parallel-connected resonators):
  $w'_1 = 232,5$ µm
  $w'_2 = 67,5$ µm The periods of these two resonators are determined so as to accurately link the frequencies to each other. That is to say, they are approximately:
  for the first resonator, a period of 17.95 µm
  for the second resonator, a period of 17.94 µm FIG. 18 shows the installation representing the electrical bridge made with the first resonator in two arms and the second resonator in the other two arms.

For reasons of space requirement, the two inputs E+ are parallel-connected by a wire and not a track.

Figure 19:
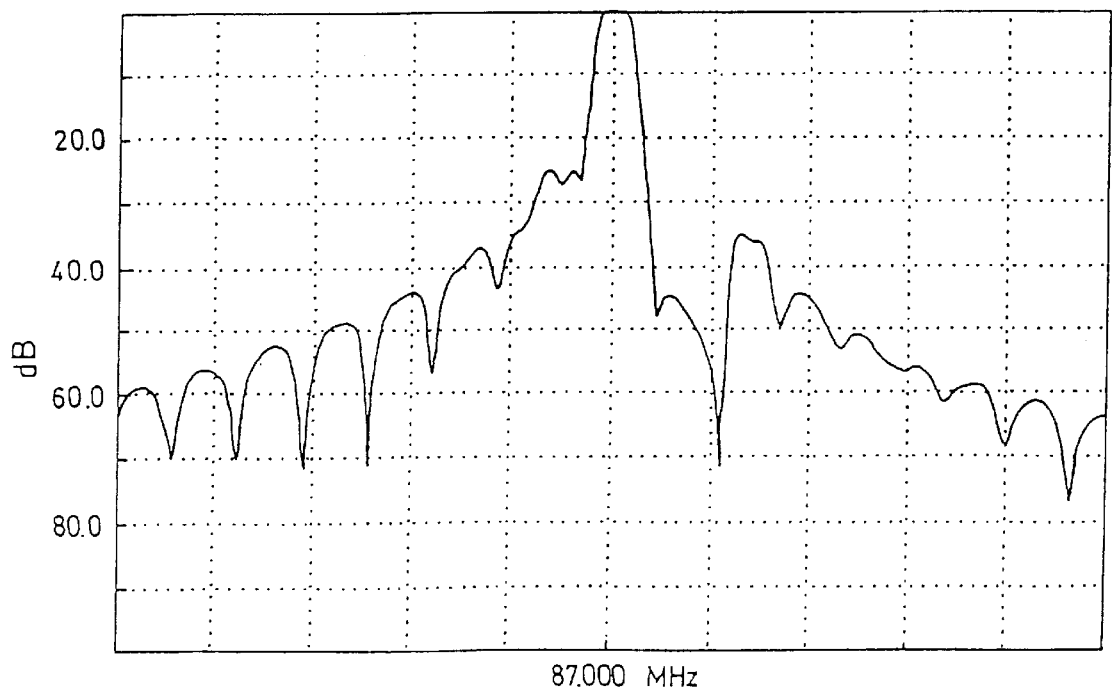
FIG. 19 illustrates the transfer function of the 87 MHz filter made according to the invention.

The filter is designed to work with an impedance value of 4,000Ω with a parallel-connected inductor. Its transfer function is illustrated in FIG. 19.

What is claimed is:

1. Surface-acoustic-wave filter with N poles, N being a number greater than or equal to 3 and comprising a set of resonators, characterized in that:
  the resonators are electrically coupled to form a four-arm electrical bridge;
  two arms comprising, two identical sub-assemblies $E_1$ and $E_3$ of $N_1$ parallel-connected resonators;
  two arms comprising two identical sub-assemblies $E_2$ and $E_4$ of $N_2$ parallel-connected resonators;
  with $N_1 + N_2 = N$;
  the product of the total static capacitance of the sub-assembly $E_1$ multiplied by the total static capacitance of the sub-assembly $E_3$ bring substantially equal to the product of the total static capacitance of the sub-assembly $E_2$ multiplied by the total static capacitance of the sub-assembly $E_4$, so as to balance the electrical bridge.

2. Surface-acoustic-wave filter according to claim 1, characterized in that N is an even number and $N_1 = N_2 = N/2$.

3. Surface-acoustic-wave filter according to claim 1, characterized in that N is an odd number and $N_1 = (N-1)/2$ et $N_2 = (N+1)/2$.

4. Surface-acoustic-wave filter according to claim 1, characterized in that at least one arm comprises a single surface wave device having an admittance equivalent to the parallel connection of a sub-assembly of resonators.

5. Surface-acoustic-wave filter according to claim 1, characterized in that at least one arm comprises a structure equivalent to several parallel-connected resonators, said structure comprising two networks of interdigitated electrodes constituting the transduction part of the resonators, said networks being connected to two buses with different polarities in comprising m acoustic channels inserted between the two buses, the $i^{th}$ channel possessing a pitch $p_i$ of electrodes on a length of electrodes $w_i$ and $1 \leq i \leq m$.

6. Surface-acoustic-wave filter according to claim 5, characterized in that the $i^{th}$ acoustic channel comprises two reflective arrays on each side of the transduction part.

7. Surface-acoustic-wave filter according to claim 5, characterized in that the two consecutive acoustic channels are connected to each other by metallizations $m_i$, connecting the electrodes separated by a pitch $p_i$ to the electrodes separated by a pitch $p_{i+1}$.

8. Surface-acoustic-wave filter according to claim 5, characterized in at least one arm comprises a structure equivalent to two parallel-connected resonators and said structure comprises an upper acoustic channel and a lower acoustic channel with an electrode pitch $p_1$ and an electrode length $w_1$, a central acoustic channel with an electrode pitch $p_2$ and an electrode length $w_2$, the electrodes of the array of electrodes connected to the first bus of the upper acoustic channel being aligned with the electrodes of the array of electrodes connected to the second bus of the lower acoustic channel.

9. Surface-acoustic-wave filter according to claim 5, characterized in that the pitch values $p_1$ and $p_2$ are equal and in that the structure comprises two acoustic channels, the electrodes of each of the arrays of electrodes being offset by a distance $p_1$ between the two acoustic channels.

10. Surface-acoustic-wave filter according to claim 1, characterized in that at least one of the arms comprises a structure equivalent to at least two parallel-connected resonators, said structure comprising two interdigitated electrode arrays, said arrays being connected to a first bus and a second bus with different polarities so as to define a transducer having a central axis (Z) parallel to the electrodes, said transducer comprising electrodes positioned symmetrically with respect to the central axis and connected to the first bus and comprising electrodes positioned symmetrically with respect to the central axis and connected to the second bus with opposite polarity, so as to excite symmetrical longitudinal modes and antisymmetrical longitudinal modes.

11. Surface-acoustic-wave filter according to claim 10, characterized in that the transducer is inserted between two reflector arrays.

12. Surface-acoustic-wave filter according to claim 1, characterized in that at least one of the arms comprises a DART type resonator with transduction cells interposed between reflection cells.

13. Surface-acoustic-wave filter according to claim 12, characterized in that the DART type resonator comprises resonant cavities.

14. Surface-acoustic-wave filter according to claim 12, characterized in that the number of poles is an even number and in that the distance between the transduction center of a transduction cell and the reflection center of the reflection cell adjacent to said transduction cell is in the range of $(3\pm d)\lambda/8+k\lambda/2$, with $\lambda$ being the wavelength corresponding to the center frequency of the filter, d being smaller than 1 and k being an integer.

15. Surface-acoustic-wave filter characterized in that it comprises the series connection of several sets of resonators, of which at least one set of resonators corresponds to claim 1.

* * * * *